(12) United States Patent
Yoo

(10) Patent No.: US 6,528,435 B1
(45) Date of Patent: Mar. 4, 2003

(54) PLASMA PROCESSING

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 65 days.

(21) Appl. No.: 09/648,730

(22) Filed: Aug. 25, 2000

(51) Int. Cl.$^7$ .................. H01L 21/31; H01L 21/469
(52) U.S. Cl. .................. 438/788; 438/788; 438/758; 438/778; 438/913; 118/715; 118/723; 414/935
(58) Field of Search .................. 438/788, 758, 438/770–778, 478, 680, 913; 118/723, 715; 414/271, 935; 269/21; 432/93

(56) References Cited

U.S. PATENT DOCUMENTS

| | | | | |
|---|---|---|---|---|
| 4,341,582 A | * | 7/1982 | Kohman et al. ........... 156/345 |
| 4,801,241 A | * | 1/1989 | Zajac et al. ............... 414/786 |
| 5,409,539 A | * | 4/1995 | Turner et al. ............. 118/719 |
| 5,455,082 A | * | 10/1995 | Saito et al. ............... 427/452 |
| 5,874,129 A | * | 2/1999 | Beinglass et al. ....... 427/248.1 |
| 5,909,994 A | * | 6/1999 | Blum et al. ............... 414/217 |
| 6,001,182 A | * | 12/1999 | Page et al. ................ 118/715 |
| 6,258,718 B1 | * | 1/2000 | Leiphart et al. ........... 438/680 |
| 6,087,276 A | * | 7/2000 | Yeh et al. .................. 438/788 |
| 6,138,694 A | * | 10/2000 | Hansen et al. ............. 134/58 |
| 6,159,333 A | * | 12/2000 | Gupta et al. ............... 156/345 |
| 6,174,370 B1 | * | 1/2001 | Yoshida ..................... 118/500 |
| 6,193,506 B1 | * | 2/2001 | Muka ........................ 432/241 |
| 6,281,147 B1 | * | 8/2001 | Yamazaki et al. ......... 438/788 |
| 6,321,680 B2 | * | 11/2001 | Cook et al. ............... 118/723 E |

FOREIGN PATENT DOCUMENTS

| EP | 0 359 567 | 6/1990 | ........... C23C/16/50 |
|---|---|---|---|
| EP | 0 428 161 | 5/1991 | ........... H01J/37/34 |

OTHER PUBLICATIONS

Patent Abstracts of Japan, vol. 009, No. 280 (E–356), Nov. 8, 1985, & JP 60 123032 A (Dainamitsuku Internatl KK), Jul. 1, 1985, abstract (1 page).
Novellus Systems, Apr. 1997, Color handout, Dielectrics, Pearl PECVD Anti–reflective layers.
Novellus Systems, Dec. 1996, Color handout, Dielectrics, PECVD Silane Oxide.
Novellus Systems, Jun. 1999, Color Brocheur, Sequel Express.
Novellus Systems, Advantages of Dual Frequency PECVD for Deposition of ILD and Passivation Films, Evert P. Van de Ven, I–Wen Connick, Alain S. Harrus, IEEE VLSI Multi-level Interconnection Conference, Jun. 12–13, 1990.

* cited by examiner

Primary Examiner—Matthew Smith
Assistant Examiner—Granvill D Lee, Jr.
(74) Attorney, Agent, or Firm—MacPherson Kwok Chen & Heid LLP

(57) ABSTRACT

An apparatus and method for depositing a thin film on a semiconductor substrate. The apparatus includes a chamber or housing suited for holding a plurality of wafer platforms. The wafer platforms are arranged stacked in the chamber equidistant and electrically isolated from each other wafer platform. At least two of the plurality of wafer platforms are electrically coupled to a power source to form a first electrode and a second electrode. The remainder of the plurality of wafer platforms are disposed therebetween. In this manner, the first electrode and the second electrode form a single series capacitor. At least one reactant gas is provided in the chamber and reacted with sufficiently supplied energy to form a plasma. Radicals or ions from the plasma react on the surface of the wafers to cause a thin film layer to be distributed on the equally dispersed wafers positioned on a surface of the wafer platforms.

18 Claims, 6 Drawing Sheets

PLASMA PROCESSING

BACKGROUND OF THE INVENTION

1. Field of the Invention

The invention is related to semiconductor processing, and more particularly to an improved plasma processing system and method for forming a dielectric layer and/or a thin film on a semiconductor substrate.

2. Description of the Related Art

Many processes are known for depositing film layers on semiconductor products. For example, plasma chemical vapor deposition is widely used in the semiconductor industry. This deposition process can be used for depositing such films as, $SiO_2$, SiN, $Ta_2O_5$, Si epitaxy, dielectrics, metal films and others. A typical chemical vapor deposition process begins with the in-situ deposition of the reactants in a reaction deposition chamber. The reactant gases are introduced into the chamber through an inlet port and are excited to create ions or radicals by a high electric field created by an RF voltage. The electric field causes the inlet gas to become excited enough to form a glow discharge or plasma. Plasma enhanced deposition occurs when the molecules of the incoming gases are broken up in the plasma and the appropriate ions are recombined on the substrate surfaces to give the desired film.

The increased complexity of creating multilevel deposited films has greatly challenged known deposition methods. To enhance film quality, film deposition requirements have become more stringent.

One approach to enhance film quality is using dual frequency in PECVD processes. As shown in FIG. 1, a typical dual frequency PECVD configuration 10 includes a first electrode 12 and a second electrode 14. First electrode 12 is electrically coupled to a 13.56 MHz RF generator through a high pass filter 16 and a matching network 18. Second electrode 14 is a heated susceptor electrically coupled to a 300–400 KHz LF power supply through a low pass filter 20 and a matching transformer 22. The combination of high and low frequency provides a stable discharge, generates the reactive species and assures coupling to substrate 24, while providing the ion bombardment/implantation.

To increase throughput and enhance quality, the dual frequency PECVD configuration has been used in multistation sequential deposition chambers. As shown in FIG. 2A, a typical multistation sequential deposition chamber 26 includes a plurality of RF electrodes, such as electrodes 28a and 28b, and a base electrode 30, which is coupled to an LF power supply. For example, in an N station system, a film layer 1/N of the total thin film thickness T (FIG. 2B) is deposited at each station.

Unfortunately, although the multistation approach can provide an increase in throughput, the approach can create a non-homogeneous thin film to develop on the surface of the wafer. The non-homogeneity occurs because at plasma ignition and at the completion of the plasma process, the plasma physical properties tend to be unstable. Therefore, whenever a thin film layer is formed, the layer tends to be non-homogenous at its top and bottom surfaces. In the multistation approach, the plasma on/off cycle is repeated at each station. Thus, non-homogenous interface portions I (FIG. 2B) can develop between each subsequently deposited layer.

Although an attempt is made to match each station of the multistation approach electrically (in parallel), the separate electrical connections made from each electrode to the power supply can create deposition uniformity problems. For example, the variability may occur simply due to the lengths of the cables used to power the electrodes.

For these reasons, what is needed is an improved process for depositing film on a substrate, metal barrier, or etch stop layer, such that the film exhibits, for example, improved chemical stability, deposition rate, uniformity of thickness, and adhesion characteristics.

SUMMARY OF THE INVENTION

The present invention provides an apparatus and method for depositing a thin film on a semiconductor substrate. In accordance with the present invention the apparatus includes a chamber or housing which is suited for holding a plurality of wafer platforms. The wafer platforms are arranged stacked in the chamber equidistant and electrically isolated from each other wafer platform. Advantageously, at least two of the plurality of wafer platforms are electrically coupled to a power source to form a first electrode and a second electrode. The remainder of the plurality of wafer platforms are disposed therebetween. In this manner, the first electrode and the second electrode form a single series capacitor. A reactant gas is provided in the chamber and reacted with sufficiently supplied energy to form a plasma. Radicals or ions from the plasma react on the surface of the wafers to cause a thin film layer to be distributed on the equally dispersed wafers positioned on a surface of the wafer platforms.

By forming a single series capacitor, which encompasses the plurality of wafers, the present invention subjects the wafers equally to ions or radicals formed in the plasma, which permits the formation of a uniform thin film. The present invention is geometry dependent, such that once the distance between each wafer platform is determined and fixed, no more adjustment is necessary. Thus, the matching condition between batches of processed wafers can be high, which means uniformity between batches of wafers is increased. Because the geometry is fixed no moving of electrodes is necessary. The lack of significant moving parts provides increased reliability of the system. Also, since the thin film is developed at one station, there is no formation of non-homogenous interfaces within the thin film. The geometry of the processing system dictates that the wafers be stacked, which reduces the overall footprint of the processing system.

These and other features and advantages of the present invention will be more readily apparent from the detailed description of the embodiments set forth below taken in conjunction with the accompanying drawings.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments of the present invention will be described with reference to the aforementioned figures. These figures have been simplified for ease of understanding and describing the embodiments.

Figure 1:
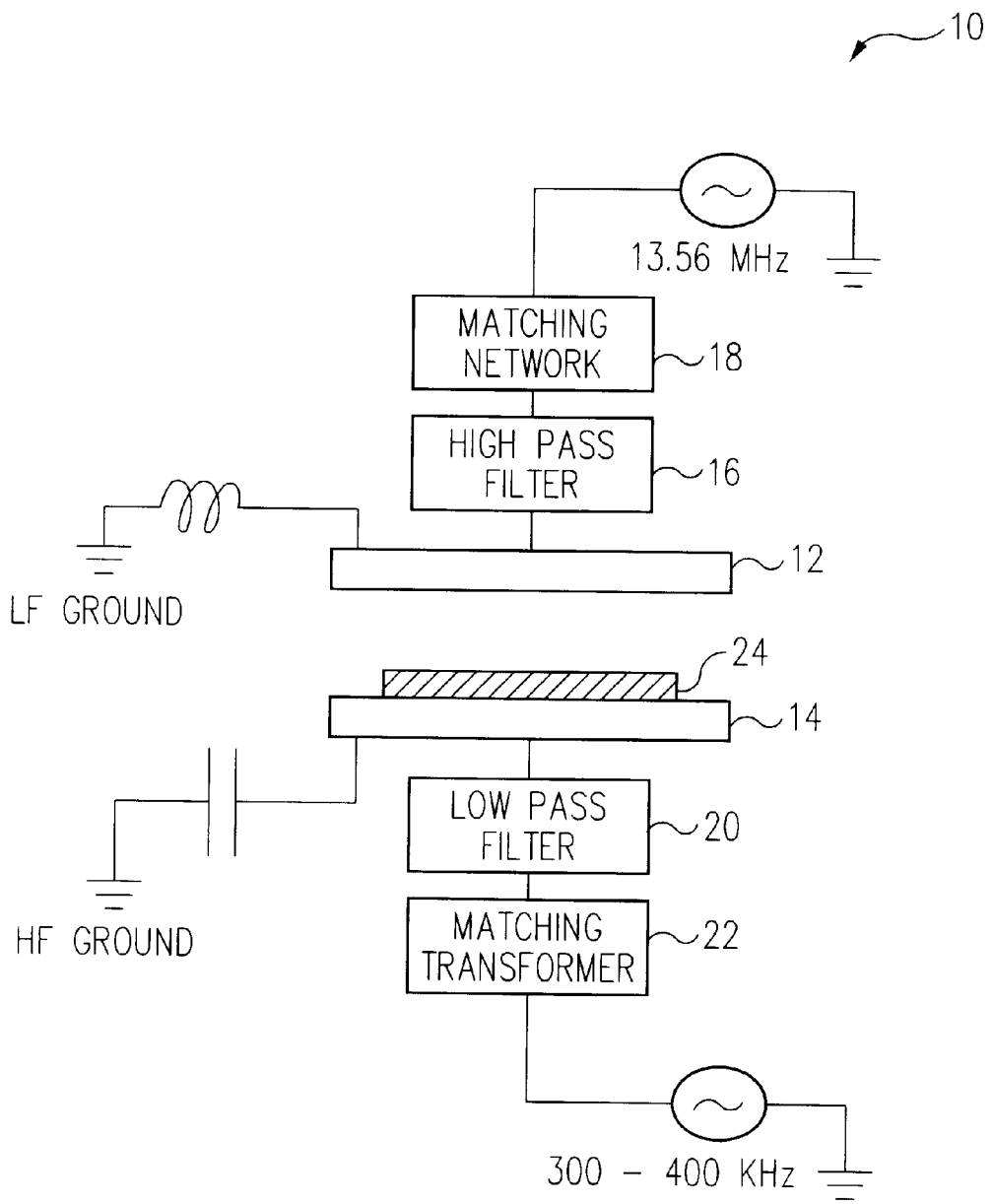
FIG. 1 is a schematic diagram of a typical CVD system.
Figure 2B:
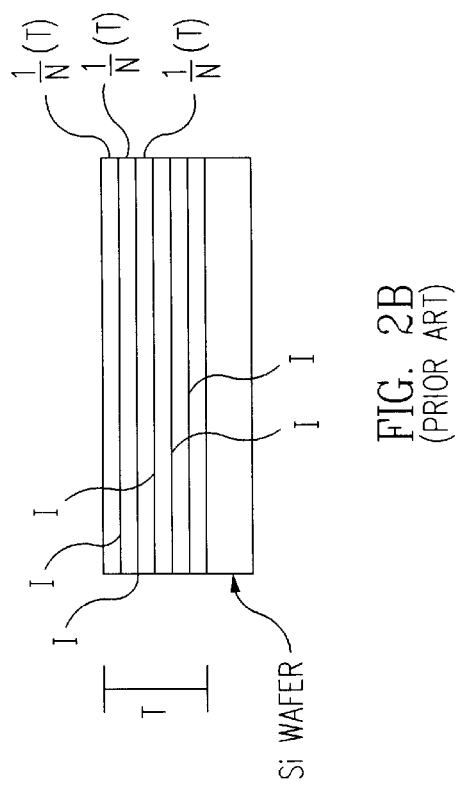
FIG. 2B is a simplified representation of a product of the system of FIG. 2A.
Figure 2A:
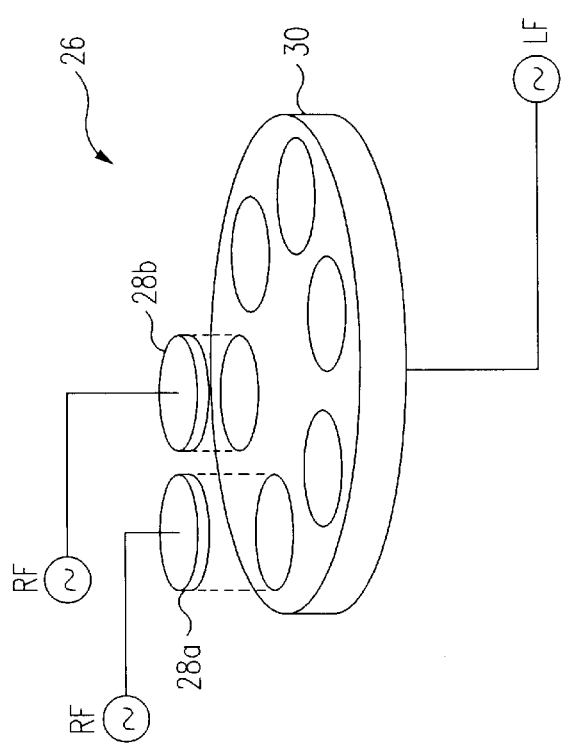
FIG. 2A is a simplified perspective view of a typical multistation sequential CVD processing chamber.
Figure 3:
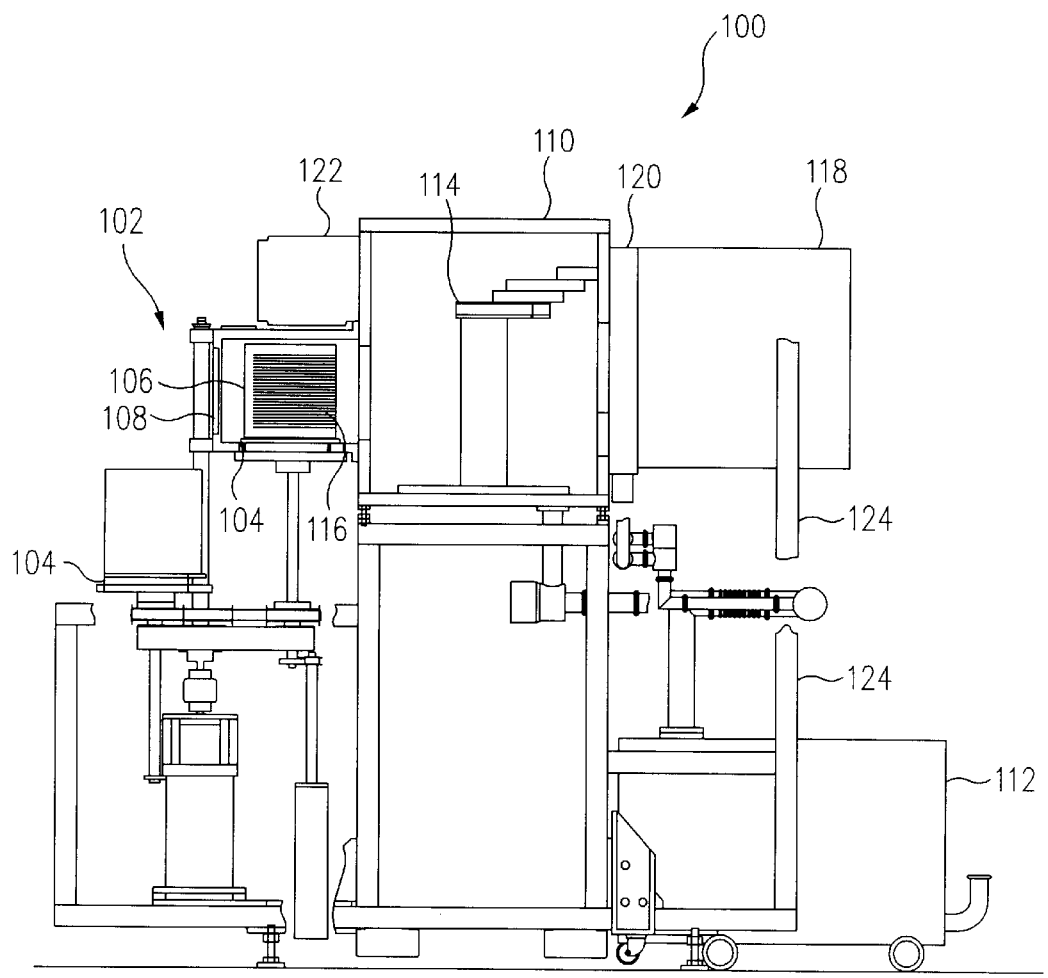
FIG. 3 is an illustration of a side view of one embodiment of a semiconductor wafer processing system for use with the present invention.

FIG. 3 is a schematic illustration of a side view of one embodiment of a semiconductor wafer processing system 100 that establishes a representative environment of the present invention. A representative type of wafer processing system 100 is fully disclosed in U. S. patent application Ser. No. 09/451,677, filed Nov. 30, 1999, which is herein incorporated by reference for all purposes. Processing system 100 includes a loading station 102, which has multiple platforms 104 for supporting and moving a wafer cassette 106 up and into a loadlock 108. Wafer cassette 106 may be a removable cassette that is loaded into a platform 104, either manually or with automated guided vehicles (AGV). Wafer cassette 106 may also be a fixed cassette, in which case wafers are loaded onto cassette 106 using conventional atmospheric robots or loaders (not shown). Once wafer cassette 106 is inside loadlock 108, loadlock 108 and transfer chamber 110 are maintained at atmospheric pressure or else are pumped down to a vacuum pressure using a pump 112. A robot 114 within transfer chamber 110 rotates toward loadlock 108 and picks up a wafer 116 from cassette 106. A reactor or processing chamber 118, which may also be at atmospheric pressure or under vacuum pressure, accepts wafer 116 from robot 114 through a gate valve 120. Robot 114 then retracts and, subsequently, gate valve 120 closes to begin the processing of wafer 116. After wafer 116 is processed, gate valve 120 opens to allow robot 114 to pick-up and place wafer 116 into cooling station 122. Cooling station 122 cools the newly processed wafers before they are placed back into a wafer cassette in loadlock 108.

Figure 4:
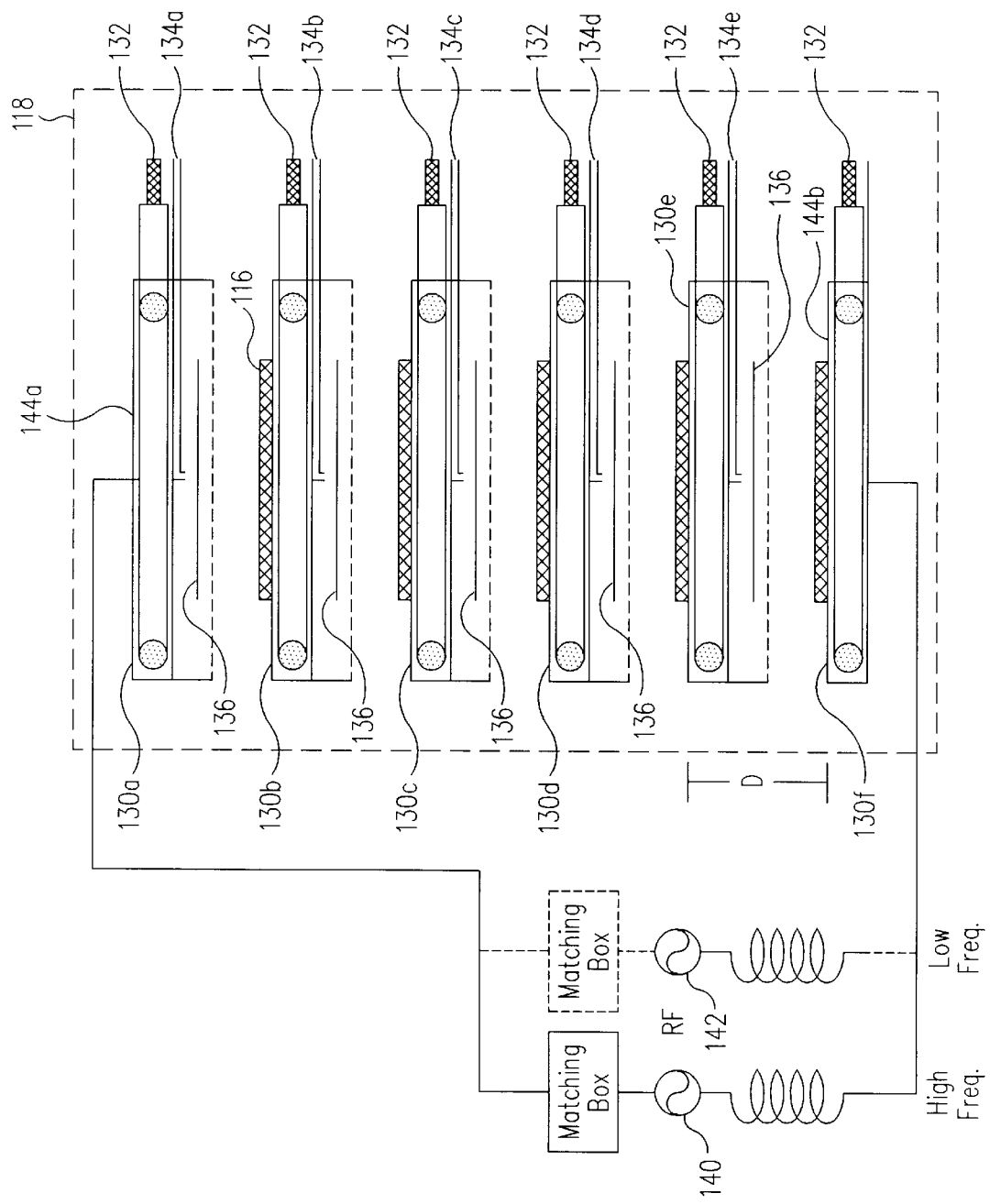
FIG. 4 is a simplified schematic illustration of an embodiment of the present invention.

In one embodiment, reactor 118 may be any reactor used for chemical vapor deposition and similar processes. In one embodiment, as shown in FIG. 4, process chamber 118 is a CVD chamber, which may be used to form, for example, a plasma enhanced chemical vapor deposition (PECVD) film on a substrate, such as substrate 116. CVD chamber 118 is of a size suitable for holding a plurality of substrates 116, which are supported in CVD chamber 118 on a plurality of platforms 130a–130f.

As shown in FIG. 4, each platform 130a–130f includes a heating member or element 132, a gas inlet source 134, and a baffle 136. In this embodiment, platforms 130a–130f are stacked and positioned equally spaced apart a distance D. To provide adequate deposition uniformity, each platform 130a–130f is equally spaced between about 30 mm and about 100 mm; preferably between about 40 mm and about 60 mm. Platforms 130a–130f may have a large mass relative to wafer 116, and may be fabricated from a material, such as silicon carbide coated graphite, graphite, inconel, aluminum, steel, or any other material that is electrically conductive and does not significantly react at high processing temperatures with any ambient gases or with wafer 116. Each platform 130a–130f is electrically isolated from each other platform using, for example, dielectric mounts or spacers (not shown) positioned in-between each platform 130a–130f.

In one embodiment, wafers 116 are placed directly on a top surface of wafer platforms 130b–130f. The total contact area between wafers 116 and wafer platforms 130b–130f is less than or equal to the wafer surface area. In an alternative embodiment, wafer supports (not shown) extend out from the surface of each wafer platform (Note: In this alternative embodiment, there is no need for wafer supports on the top surface of platform 130a since it is not intended to support a wafer). The wafer supports are sized to ensure that wafers 116 are held in close proximity to the platforms. For example, the wafer supports may each have a height of between about 50 $\mu$m and about 20 mm, preferably about 2 mm to about 8 mm. At least three wafer supports may be used to ensure stability.

Platforms 130a–130f may be formed into any geometric shape, preferably a shape which resembles the shape of wafers 116. In a preferred embodiment, each platform 130a–130f is a circular plate. The dimensions of the platforms may be larger than the dimensions of wafers 116, such that the surface area of wafer 116 is completely covered by the surface area of the platforms 130a–130f.

As shown in FIG. 4, platforms 130a–130f include a heating element 132, which provides a source of heat. Heating element 132 may be a resistive heating element or other conductive/radiant heat source, which can be made to contact a portion of platforms 130a–130f or may be embedded within the platforms. The resistive heating element may be made of any high temperature rated material, such as a suitable resistively heatable wire, which is made from a high mass material for increased thermal response and high temperature stability, such as SiC, SiC coated graphite, graphite, AlCr, AlNi and other alloys. Resistive heating elements of this type are available from Omega Corp. of Stamford, Conn.

The temperature of platforms 130a–130f may be controllable to provide a variable temperature to the platforms depending on the application. However, once the platforms are heated to a preferred temperature, the temperature of each platform remains equal, uniform and consistent. The temperature of each platform 130a–130f may be varied between about 50° C. and about 800° C., preferably between about 100° C. and about 600° C.

As is typical of chambers used in the processing of semiconductor wafers, chamber 118 can be evacuated or pressurized as desired by a suitable pump apparatus schematically illustrated in FIG. 3 by pump 112.

Selected gases used in PECVD processing are introduced into chamber 118 through a suitable manifold system from various gas supply reservoirs. The gases may include, for example, $N_2$, $O_2$, $H_2$, $NH_3$, $N_2O$, $NO_2$, $NO$, $SiH_4$, $Si_2H_6$, $PH_3$, $AsH_3$, $B_2F_6$, $C_2F_6$, $C_3F_8ClF_6$, and $WF_6$. The gases are introduced into chamber 118 through a plurality of gas inlet ports 134a–134e. In one embodiment, gas inlet ports 134a–134e are each mounted to a portion of each platform 130a–130e. More specifically, in this embodiment, each gas inlet port 134a–134e is positioned on a bottom side of the respective platform 130a–130e so that the gases can be directed toward each wafer 116.

Figure 5:
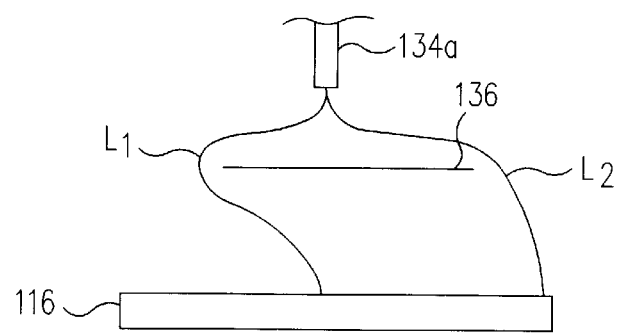
FIG. 5 is a simplified illustration of an embodiment of a baffle in accordance with the present invention.

As shown in FIG. 4, a baffle 136 is positioned between each gas inlet port 134a 134e and each wafer 116. FIG. 5 is a simplified illustration of baffle 136 positioned between gas inlet port 134a and wafer 116. Baffle 136 is used to uniformly disperse the gases along the length of wafer 116. In this exemplary embodiment, baffle 136 is a flat plate, which creates an interference with the flow of the process gases exiting gas inlet port 134a. Bottle 136 causes the path $L_1$ of a first gas molecule to a first portion of the surface of wafer 116 to be approximately equal to path $L_2$ of a second gas molecule to a second portion of the surface of wafer 116. In an alternative embodiment, baffle 136 can have a plurality of holes. Each hole being sized to allow gasses to be dispersed along the length of baffle 136 such that the gas molecules uniformly impinge on the surface of wafer 116. The overall dimension of baffle 136 and its position relative to the gas inlet ports is determined once the operating pressure, gas flow rate and wafer size are determined.

The deposition rates and the concentrations of the films are selectively controlled by the flow rates of the reactant gases, the dual-frequency power, the chamber pressure, and the process temperature within chamber 118. As mentioned above the pressure inside chamber 118 may be controlled. In a preferred embodiment, the ambient pressure during the deposition may generally be maintained from about 0.1 Torr to about 5 Torr, preferably in the range of about 1 Torr to about 2.6 Torr, for example 2.1 Torr. Maintaining the pressure within these levels during the PECVD process can improve the film deposition rate.

As the gases enter chamber 118, suitable plasma power is applied. As mentioned above, chamber 118 may be a dual-frequency chamber providing both HF and LF power. The typical HF plasma energy used in PECVD chambers is 13.56 MHz, although the invention is not limited to any exact high-frequency value. In one embodiment, suitable plasma power includes HF energy (from about 1–30 MHz) at an energy level preferably between about 0.3 watts per square cm and about 30 watts per square cm of substrate surface. The low-frequency RF power, generally in the range of between about 100 kHz to about 500 kHz, may have an energy level ranging from about 0.3 watts per square cm of substrate surface to about 100 watts per square cm of substrate surface.

As is known to those skilled of in the art PECVD processing, the plasma energy in chamber 118 ionizes the introduced gases, generating radicals which are deposited on a surface of each wafer 116 to arrive at the desired product. The reactant gases may include, for example, $N_2$, $O_2$, $H_2$, $NH_3$, $N_2O$, $NO_2$, $NO$, $SiH_4$, $Si_2H_6$, $PH_3$, $AsH_3$, $B_2F_6$, $C_2F_6$, $C_3F_8ClF_6$, and $WF_6$ which provide discharge of radicals, such as $F^*$, $N^*$, $O^*$, $H^*$ and $Si^*$.

Plasma energy is supplied to chamber 118 through an RF generator 140 which supplies high-frequency (HF) RF power. Since chamber 118 is a dual frequency chamber, low-frequency (LF) generator 142 is used for supplying LF power to chamber 118. In one embodiment, RF generator 140 and LF generator 142 are operatively coupled to platforms 130a and 130f, relatively, such that platforms 130a and 130f become first and second electrodes 144a and 144b, respectively. In this manner, the stacked configuration of platforms 130a–130f form a series capacitor. Because the platforms are each equally spaced and electrically isolated, the plasma formed in chamber 118 is dispersed equally and uniformly between first and second electrodes 144a and 144b. This configuration of platforms 130a–130f provides the advantage of creating a CVD processing chamber where each platform is matched geometrically and electrically to provide processing uniformity.

Figure 6:
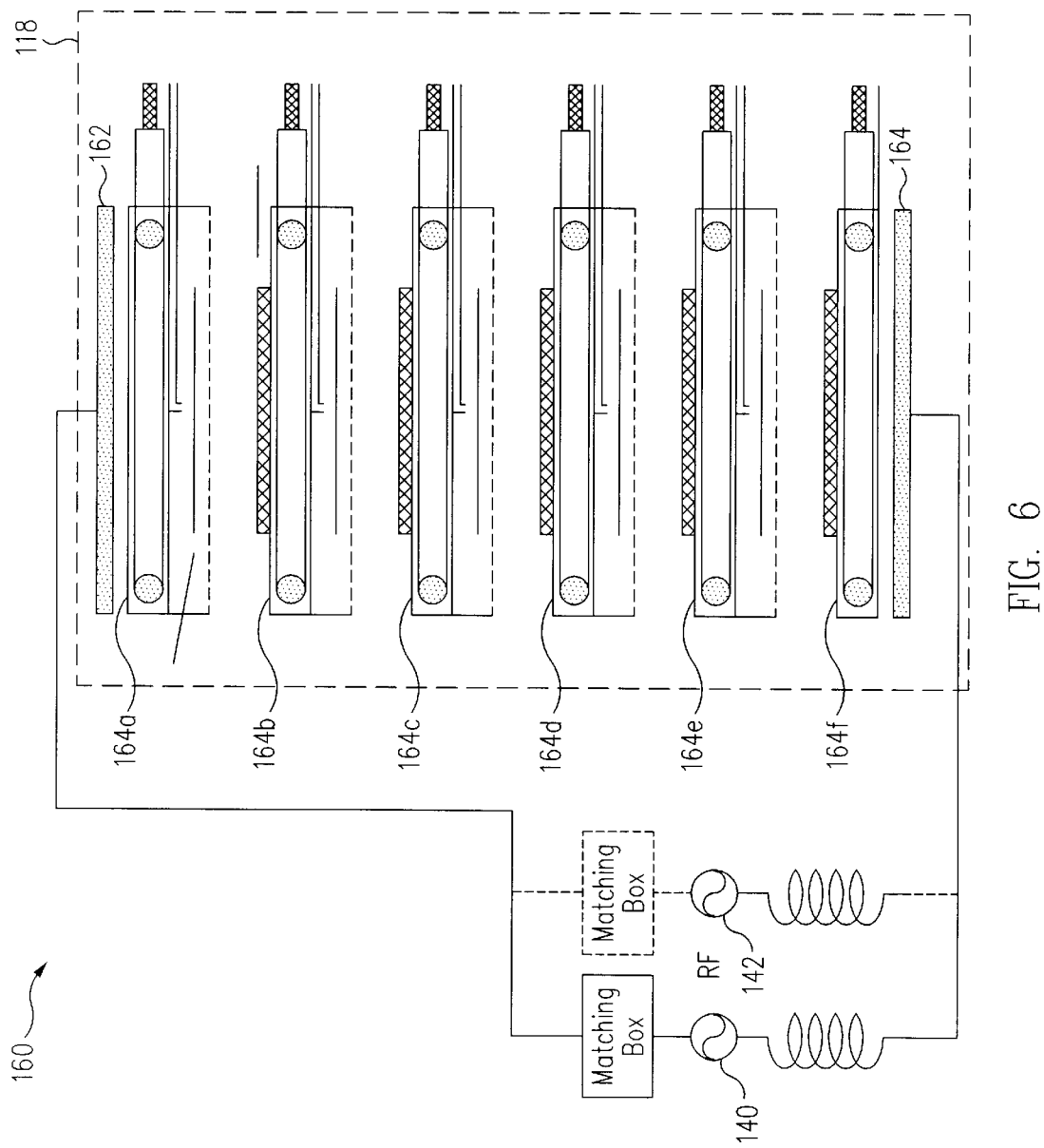
FIG. 6 is a simplified schematic illustration of another embodiment of the present invention.

FIG. 6 shows a processing chamber 150 in accordance with an alternative embodiment of the present invention. In this alternative embodiment, process chamber 118 performs substantially as described above with the following exception. In this embodiment, platforms 130a–130f are operatively coupled to RF high frequency generator 140 and RF low frequency generator 142 to form multiple capacitors arranged in series to function as the equivalent of a single capacitor. For example, platforms 152a, 152c and 152e are electrically coupled in series to form a top electrode. Platforms 152b, 152d, and 152f are electrically coupled in series to form a bottom electrode. Accordingly, platforms 152a and 152b form a capacitor that surrounds wafer 154a, platforms 152b and 152c form a capacitor that surrounds wafer 154b, platforms 152c and 152d form a capacitor that surrounds wafer 154c, platforms 154d and 154e form a capacitor that surrounds wafer 154d, and platforms 152e and 152f form a capacitor that surrounds wafer 154e. Because each capacitor is in series with each other capacitor, the entire arrangement acts as a single capacitor.

Figure 7:
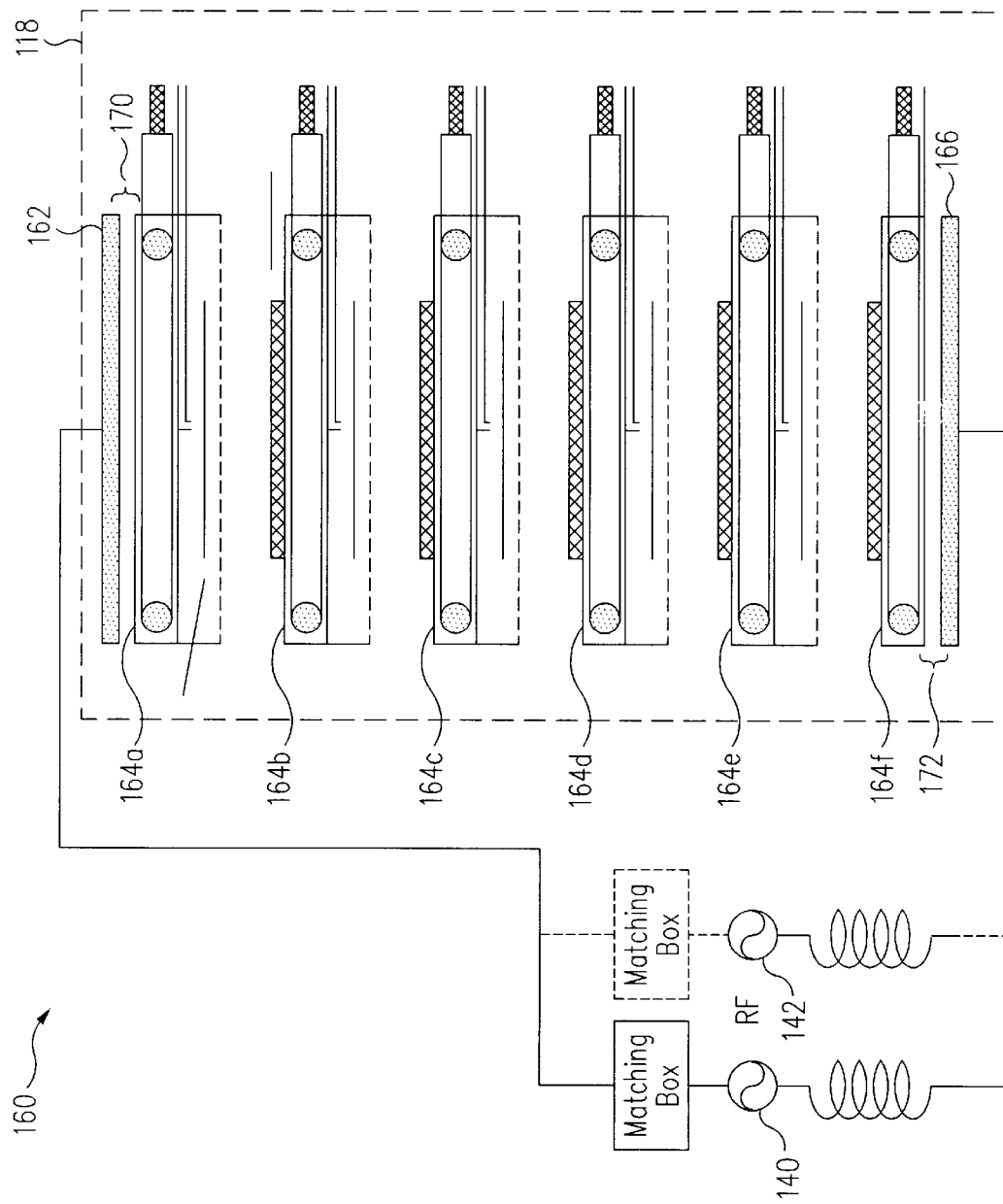
FIG. 7 is a simplified schematic illustration of yet another embodiment of the present invention.

FIG. 7 shows a processing chamber 118 in accordance with another alternative embodiment of the present invention. In this alternative embodiment, process chamber 118 performs substantially as described above with the following exception. In this embodiment, chamber 118 is operatively coupled to RF high frequency generator 140 and RF low frequency generator 142 through first electrode 162 and second electrode 166. First and second electrodes 162 and 166 are positioned on the top and bottom, respectively of the entire stack of platforms 164a–164f to form a single capacitor. As shown in FIG. 7, first electrode 162 and second electrode 166 are set apart from the stacked wafer platforms 164a–164f by gaps 170 and 172. Gaps 170 and 172 may be adjustable to vary the process gas dispersion.

While the principles of the invention have been described in connection with specific apparatus, it is to be understood that this description is not a limitation on the scope of the invention.

What is claimed is:

1. An apparatus for depositing a thin film on a wafer, the apparatus comprising:
   a chamber;
   a plurality of wafer platforms, including a first end platform and a second end platform, arranged stacked in said chamber, said first end platform and said second end platform each electrically coupled to a power source to form a first electrode and a second electrode, a remainder of said plurality of wafer platforms disposed uniformly between said first electrode and said second electrode;
   said first electrode and said second electrode forming a capacitor for reacting vapor-phase chemicals in said chamber with sufficiently supplied energy to deposit a thin film layer on wafers positioned on a surface of said wafer platforms.

2. The apparatus of claim 1, wherein each of said wafer platforms is equally spaced from each other wafer platforms.

3. The apparatus of claim 1, wherein each of said wafer platforms is electrically isolated from each other wafer platforms.

4. The apparatus of claim 1, wherein said power source is an RF power source providing high frequency energy of between about 1 MHz and about 30 MHz and a low frequency energy of between about AC 50 Hz and about 500 kHz.

5. The apparatus of claim 1, further comprising a heating element for heating said wafer platforms.

6. The apparatus of claim 5, wherein said heating element contacts each of said wafer platforms.

7. The apparatus of claim 1, further comprising a baffle for causing said vapor phase chemicals to be dispersed over a surface of said wafers.

8. The apparatus of claim 1, further comprising a plurality of inlet ports for supplying said vapor phase chemicals to said chamber; wherein at least one of said plurality of inlet ports is disposed proximate to each of said wafer platforms.

9. An apparatus for depositing a thin film on a substrate, the apparatus comprising:
- a plurality of substrate platforms each having a first surface and arranged stacked in a chamber; and
- a first electrode and a second electrode each electrically coupled to a power source to form a capacitor; said plurality of substrate platforms positioned between said first electrode and said second electrode;
- said first electrode and said second electrode capable of reacting vapor-phase chemicals in said chamber with sufficiently supplied energy to deposit a thin film layer on a substrate positioned on a first surface of at least one of said plurality of substrate platforms.

10. The apparatus of claim 9, further comprising a plurality of inlet ports for supplying said vapor phase chemicals to said chamber; wherein at least one of said plurality of inlet ports is disposed proximate to said first surface of at least one of said substrate platforms.

11. The apparatus of claim 9, further comprising a baffle for dispersing said vapor phase chemicals along said first surface of at least one of said substrate platforms.

12. The apparatus of claim 9, wherein said substrate platforms are equally space apart.

13. The apparatus of claim 9, wherein said substrate platforms are electrically isolated.

14. The apparatus of claim 9, wherein said power source is an RF power source providing high frequency energy of between about 1 MHz and about 30 MHz and a low frequency energy of between about AC 50 Hz and about 500 kHz.

15. The apparatus of claim 9, further comprising a heating element for heating said substrate platforms.

16. A process for forming a thin film on a semiconductor substrate, said process comprising:
- loading a plurality of semiconductor substrates into a processing chamber including a plurality of stacked platforms; and
- supplying power to a platform at a first end of said plurality of stacked platforms and to a platform at a second end of said plurality of stacked platforms to form a first electrode and a second electrode including at least one other platform stacked therebetween for reacting vapor phase chemicals to deposit a thin film on each of said semiconductor substrates.

17. The process of claim 16, further comprising dispersing said vapor phase chemicals along a length of said semiconductor substrates using a baffle.

18. The process of claim 16, wherein each of said platforms is electrically isolated and equal distant apart.

* * * * *